US 6,492,260 B1

(12) United States Patent
Kim et al.

(10) Patent No.: US 6,492,260 B1
(45) Date of Patent: Dec. 10, 2002

(54) METHOD OF FABRICATING DAMASCENE METAL WIRING

(75) Inventors: Young-wug Kim, Suwon; Kyung-tae Lee, Seoul, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/447,466

(22) Filed: Nov. 22, 1999

(30) Foreign Application Priority Data

Dec. 2, 1998 (KR) ............................................. 98-52515

(51) Int. Cl.[7] ........................................ H01L 21/4763
(52) U.S. Cl. ...................... 438/631; 438/633; 438/672; 438/675; 438/692; 438/687
(58) Field of Search .................................. 438/631, 633, 438/637–640, 672, 675, 622, 624, 626, 692, 687, 688

(56) References Cited

U.S. PATENT DOCUMENTS

| 5,773,364 A | * | 6/1998 | Farkas et al. ............... 438/692 |
| 5,885,866 A | * | 3/1999 | Chen ........................... 438/253 |
| 6,051,496 A | * | 4/2000 | Jang ............................ 438/687 |
| 6,100,190 A | * | 8/2000 | Kobori ........................ 438/659 |
| 6,147,000 A | * | 11/2000 | You et al. ..................... 438/687 |
| 6,169,028 B1 | * | 1/2001 | Wang et al. ................. 438/653 |
| 6,172,421 B1 | * | 1/2001 | Besser et al. ................ 257/751 |

FOREIGN PATENT DOCUMENTS

| EP | 851483 | * | 12/1997 | ......... H01L/21/768 |
| JP | 10189592 | * | 7/1998 | ........... H01L/21/88 |

* cited by examiner

Primary Examiner—Tuan H. Nguyen
Assistant Examiner—Thanh Nguyen

(57) ABSTRACT

A method of forming damascene wiring without dishing and erosion employs a dummy layer to slow or delay polishing in selected regions and thereby prevent dishing and erosion of the damascene wiring. The dummy layer is above wide damascene regions and areas containing closely packed damascene regions. Therefore, non-uniform sheet resistance of the damascene metal wiring and electro-migration due to an increase in the local current density of the metal wiring can be prevented.

28 Claims, 9 Drawing Sheets

METHOD OF FABRICATING DAMASCENE METAL WIRING

BACKGROUND OF THE INVENTION

1. Field of the Invention

The present invention relates to semiconductor devices and fabrication of semiconductor devices, and more particularly, to damascene metal wiring pattern and methods for fabricating damascene metal wiring.

2. Description of the Related Art

Recent semiconductor device manufacturing technology uses copper (Cu) as a wiring material in semiconductor devices having small feature sizes because copper has low resistivity and high resistance to electro-migration. However, copper's complicated chemical reactions makes copper difficult to pattern and use for metal wiring. For example, copper wiring patterns are easily oxidized when exposed to air. Such oxidation increases the resistance of the wiring pattern. Thus, to prevent oxidation, damascene wiring is frequently used when forming copper wiring patterns.

The process for forming damascene wiring forms and patterns an insulative layer to create damascene regions or depressions in the insulative layer. Next, a conductive material such as copper is deposited on the insulative layer, filling the damascene regions. Then, chemical mechanical polishing (CMP) or an etch-back process planarizes the conductive layer to expose the insulative layer. As a result, a damascene metal wiring pattern is left in the damascene regions. However, the planarization by CMP can result in dishing or erosion of the damascene metal wiring pattern.

Figure 1:
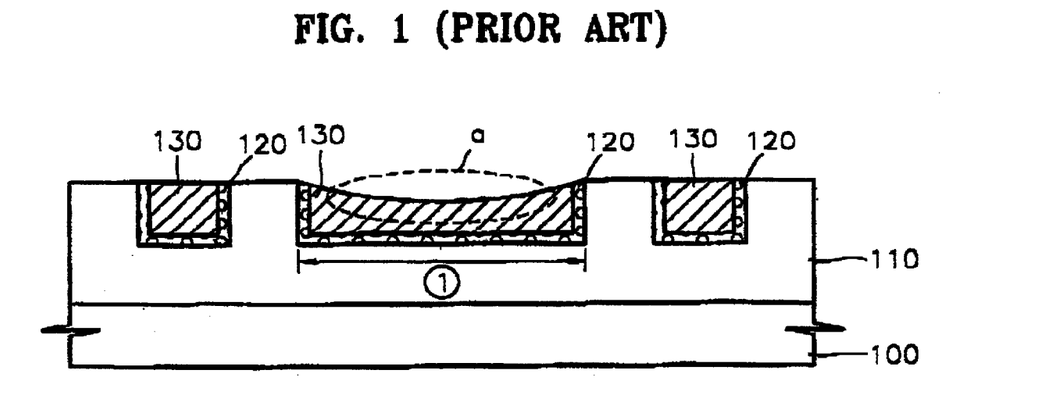
FIG. 1 is a cross-sectional view of a semiconductor structure having damascene wiring formed by a conventional method that causes dishing.

FIG. 1 is a cross-sectional view of a semiconductor device including dished metal wiring. In FIG. 1, an insulative layer pattern 110 overlies a semiconductor substrate 100, and damascene metal wiring 130 is formed in insulative layer pattern 110 by the method described above. A barrier layer 120 is between damascene metal wiring pattern 130 and insulative layer pattern 110. Region 'a' shows dishing of a portion of damascene metal wiring pattern 130. Dishing occurs because of the faster polishing rate at the center of metal wiring pattern 130 relative to polishing rate at the perimeter of metal wiring pattern 130. Thus, dishing is more severe when metal wiring pattern 130 is wider.

Figure 2:
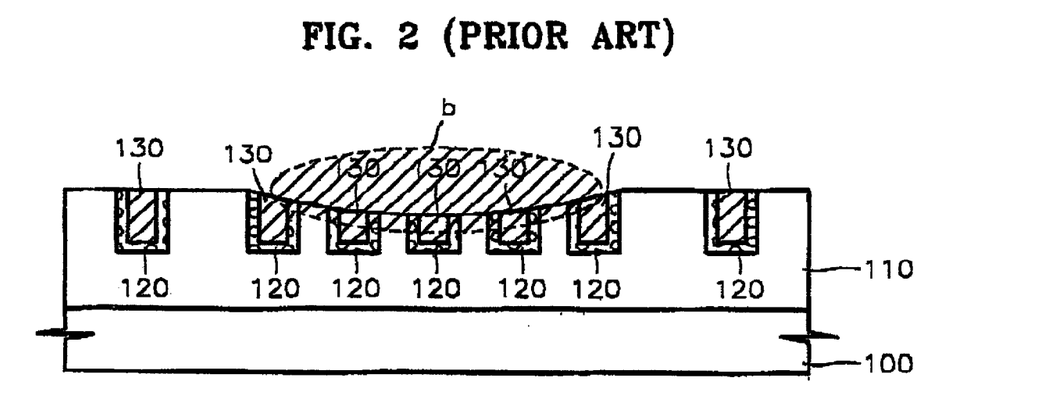
FIG. 2 is a cross-sectional view of a semiconductor structure having damascene wiring formed by a conventional method that causes erosion.

FIG. 2 is a cross-sectional view of a portion of a semiconductor device where Damascene metal wiring pattern 130 has an eroded surface. Here, region b of FIG. 2 corresponds to the eroded portion of Darnascene metal wiring pattern 130. Erosion arises from CMP during Damascene processing and occurs where there is insufficient oxide area to act as a CMP stop during the CMP planarization. The CMP process has a higher polishing rate where the percentage area of metal is higher. Accordingly, CMP can erode oxide 110 and Damascene metal wiring pattern 130 in areas. such as region b. In particular, an area including closely packed regions of metal wiring pattern 130 separated by narrow portions of insulative layer pattern 110 is susceptible to the erosion.

The dishing or erosion thins the metal wiring and thus increases the sheet resistance of the metal wiring. Further, the increase in sheet resistance is not constant. The sheet resistance may increase by tens of percentage points depending on the circumstances and the layout of the metal wiring. The high or inconsistent resistance makes the operation of a semiconductor device difficult or lowers the reliability of a semiconductor device, especially of a high power semiconductor device. In the case of analog devices that demand accurate and constant resistance of the wiring patterns, the design rules for the damasecene metal wiring pattern are considerably restricted to prevent the dishing or erosion of the damascene metal wiring pattern.

SUMMARY OF THE INVENTION

In accordance with an aspect of the invention, device fabrication process forms a dummy layer over portions of conductive layer before a CMP process. The dummy layer slows the removal of material from the covered portions of the conductive layer and thereby prevents overpolishing that could otherwise cause dishing or erosion in a Damascene wiring pattern. The dummy layers are typically removed completely when forming damascene wiring, but in some embodiment, portions of the dummy layer remain in the finished semiconductor devices.

A method according to one embodiment of the invention includes: forming an insulative layer on a semiconductor substrate; patterning the insulative layer to form a damascene region in the insulative layer; forming a conductive layer on the insulative layer, filling the damascene region; forming a dummy layer on a portion of the conductive layer that is in the damascene region of the insulative layer; and planarizing the semiconductor substrate by removing portions of the dummy layer and the conductive layer until the insulative layer is exposed. The pattern of the dummy layer is such that the dummy layer is above the wide damascene region, e.g., damascene regions that are 10 $\mu$m or more wide.

Chemical mechanical polishing (CMP) planarizes the semiconductor structure. The CMP is less selective to the dummy layer than to the conductive layer. For example, the relative selectivity between the conductive layer and dummy layer is preferably 5 to 1. In exemplary embodiments, the dummy layer is a $SiO_2$, $Si_3N_4$, $TiO_2$, or TiN layer, having the thickness between about 500 Å and 5000 Å.

In another method, the patterning of the insulative layer can form a number of damascene regions that are closely spaced. In this case, the dummy layer is formed on a portion of the conductive layer, under which the damascene regions occupy 20% or more of the area of the insulative layer. For protection of these areas during CMP, the selectivity of the dummy layer is the same as or lower than that of the conductive layer, preferably between 1:1 and 1:2. The thickness of the dummy layer is between 500 Å and 3000 Å.

The method can further include forming a second conductive layer on the dummy layer and conductive layer after forming the dummy layer. In this case, the top surface of the portion of the conductive layer below the dummy layer may be lower than the top surface of the insulative layer, preferably by 500 Å to 1000 Å so that part of the dummy layer remains after CMP planarization.

In accordance with the present invention, still another method of forming a conductive pattern of a semiconductor device includes: forming an insulative layer; patterning the insulative layer to form a plurality of damascene regions in the insulative layer; forming a conductive layer that fills the damascene regions; forming a first dummy layer on portions of the conductive layer over wide damascene regions; forming a second dummy layer on portions of the conductive layer over closely packed damascene regions; and planarizing the semiconductor substrate by removing portions of the dummy layers and the conductive layer until the insulative layer is exposed. This method combines features of the two methods described above.

Another aspect of the present invention provides a semiconductor device comprising: an insulative layer in which a damascene region is formed; a conductive layer which fills the damascene region; and a dummy layer overlying the conductive layer. The semiconductor device can further include a barrier layer between the conductive layer and the insulative layer.

In accordance with another embodiment of the present invention, a semiconductor device includes an insulative layer overlying a conductive layer or lower wiring layer. The insulative layer includes a damascene region and a via hole, and the via hole exposes the conductive layer through the damascene region. A second conductive layer fills the damascene region and the via hole, and a dummy layer overlies the damascene region.

BRIEF DESCRIPTION OF THE DRAWINGS

The features and advantages of the present invention will become more apparent by describing in detail specific embodiments thereof with reference to the attached drawings in which.

Use of the same reference symbols in different figures indicates similar or identical items.

DESCRIPTION OF THE PREFERRED EMBODIMENTS

Hereinafter, embodiments of the present invention will be described with reference to the attached drawings. In the drawings, the thicknesses of layers or regions are exaggerated for clarity. Also, a layer referred to as "on" another layer or a substrate can be directly on the other layer or the substrate, or other layers can be interposed therebetween.

Figure 3A:
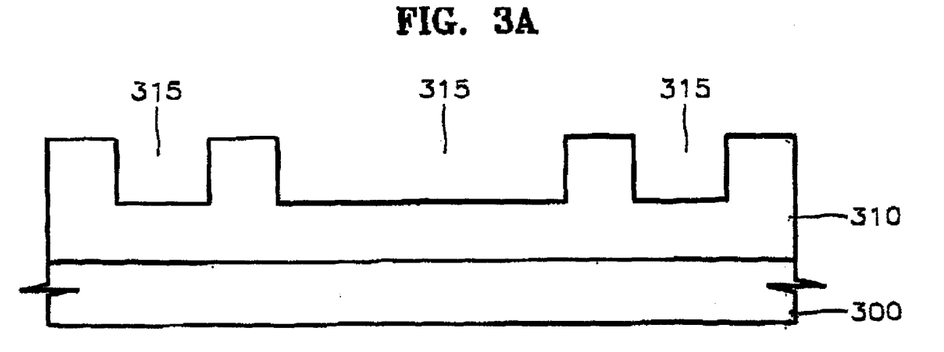
FIGS. 3A to 3E are cross-sectional views of semiconductor structures illustrating a method according to an embodiment of the present invention for forming damascene wiring including wide damascene regions.

FIGS. 3A to 3E illustrate a method of forming damascene wiring in accordance with an embodiment of the present invention. Referring to FIG. 3A, an insulative layer 310 is deposited or otherwise formed on the entire surface of a semiconductor substrate 300. Conventional photolithography and etching processes create a pattern of depressions or damascene regions 315 in insulative layer 310. Typically the depth of the damascene regions is between about 0.4 $\mu$m and about 2.0 $\mu$m.

Figure 3B:
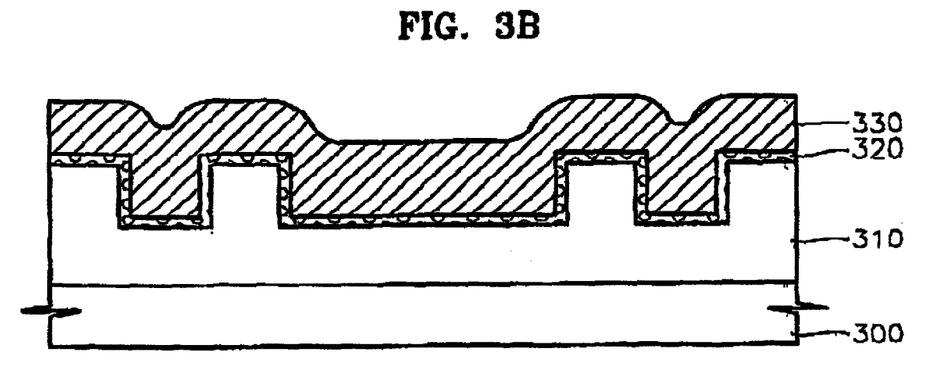

Referring to FIG. 3B, a known chemical vapor deposition (CVD) process forms a barrier layer 320 on insulative layer 310. Barrier layer 320 can be, for example, TaN or another material that adheres well to insulative layer 310 and typically has a thickness of about 450 Å. CVD also forms a conductive layer 330 is on the entire surface of barrier layer 320. Conductive layer 330 is preferably copper (Cu), but can be aluminum (Al), silver (Ag), gold (Au), or an alloy of Cu, Al, Ag or Au and has an initial thickness of about 0.7 $\mu$m to about 1.7 $\mu$m. After formation, conductive layer 330 is annealed at about 100° C. to 800° C. Annealing a metal wiring layer (conductive layer 330) enhances the uniformity of a subsequent chemical mechanical polishing (CMP) process. Annealing also reduces the resistance of the metal wiring material by enlarging the grain size of the metal wiring material.

Figure 3C:
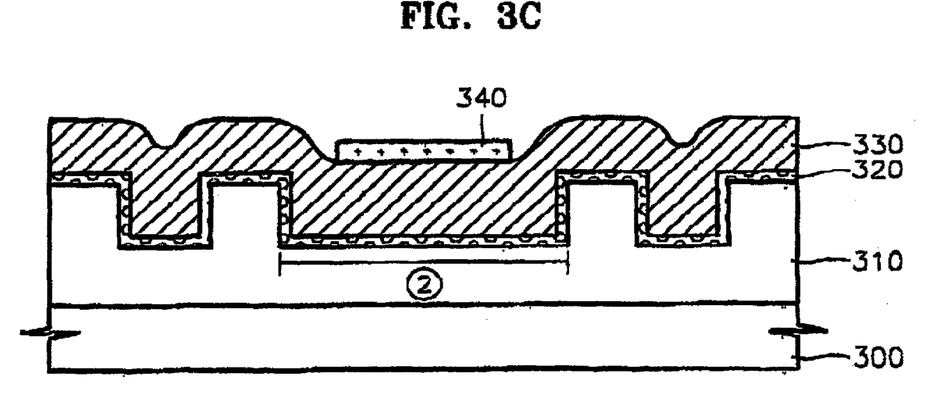

Referring to FIG. 3C, a dummy layer 340 is deposited or otherwise formed on conductive layer 330 to prevent dishing of conductive layer 330 in a later process. For example, a blanket CVD of a $SiO_2$, $Si_3N_4$, $TiO_2$, or TiN layer on the entire surface of conductive layer 330 and patterning that layer form dummy layer 340. The thickness of dummy layer 340 is preferably 500 to 5000 Å depending on the composition of dummy layer 340 and the composition and thickness of conductive layer 330. Also, it is preferable that a CMP selectivity ratio of dummy layer 340 to conductive layer 330 is about 1 to 5. The pattern of dummy layer 340 is such that dummy layer only covers portions of conductive layer 330 that fill wide damascene regions 315, for example, damascene regions wider than about 10 $\mu$m. Dummy pattern 340 does not overlie areas of insulative layer 310 not including a damascene region 315 and areas of insulative layer 310 containing a narrow damascene region 315, where dishing is not a concern.

Figure 3D:
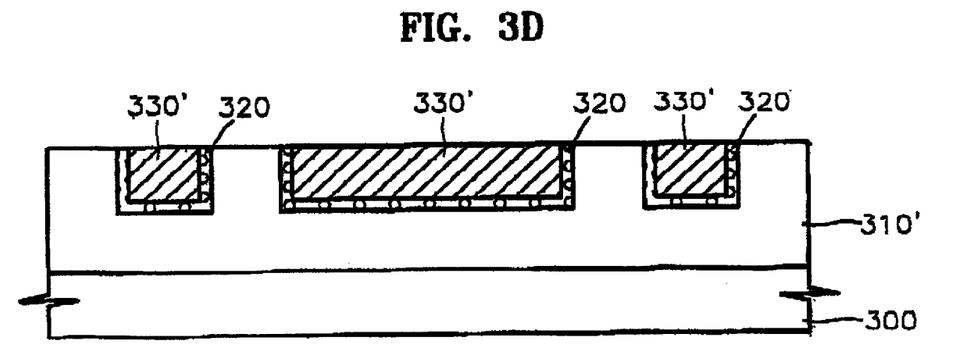

Referring to FIG. 3D, CMP planarizes the structure of FIG. 3C by removing portions of dummy layer 340, conductive layer 330, and barrier layer 320 until insulative layer 310 is exposed. As a result, dummy layer 340 of FIG. 3C delays polishing of material in wide damascene regions 315 so that a damascene wiring pattern 330' is formed without dishing.

Figure 3E:
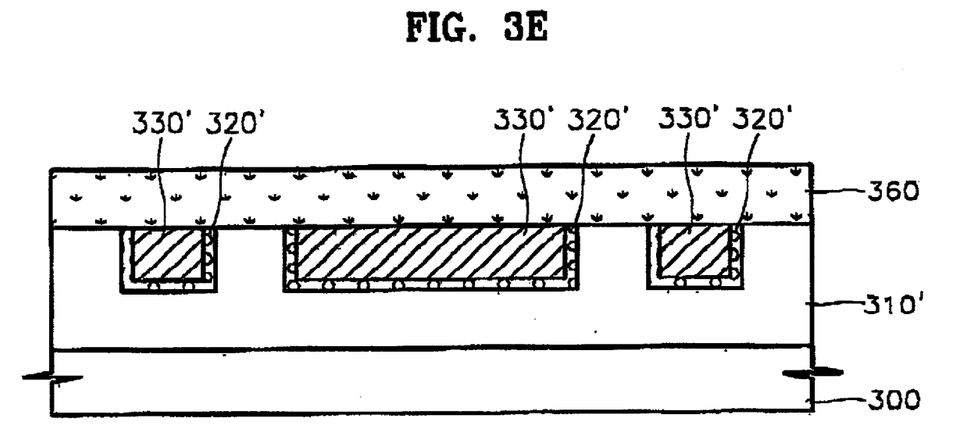

As shown in FIG. 3E, an upper dielectric layer 360 can be deposited on semiconductor substrate 300, covering damascene wiring pattern 330'. The semiconductor device can be subsequently completed using conventional processing techniques or further damascene processes in accordance with embodiments of the present invention. Also, the Damascene wiring formation method illustrated in FIGS. 3A to 3E can form a via contact connecting lower and upper metal wiring patterns to each other or a contact connecting metal wiring to an active region of a semiconductor device.

Figure 4A:
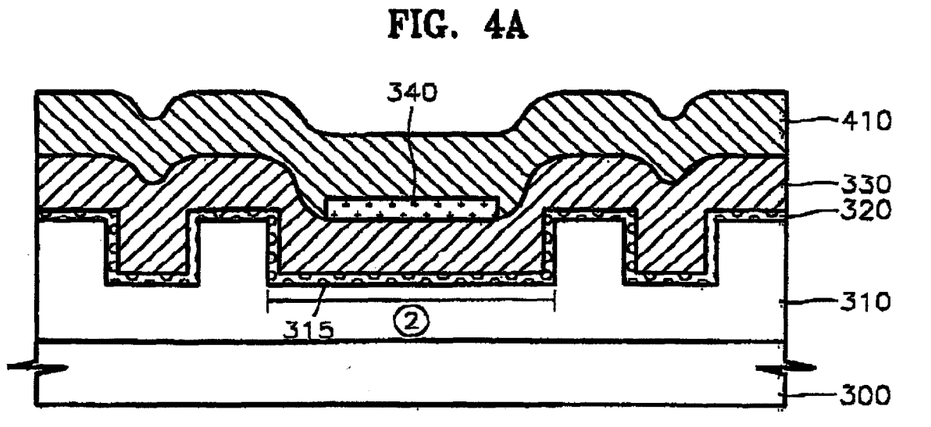
FIGS. 4A to 4C are cross-sectional views of semiconductor structures illustrating another method according to an embodiment of the present invention for forming damascene wiring including wide damascene regions.
Figure 4B:
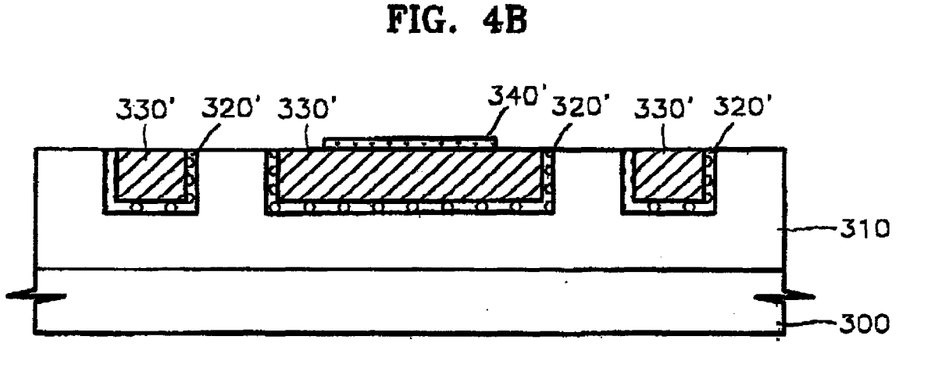
Figure 4C:
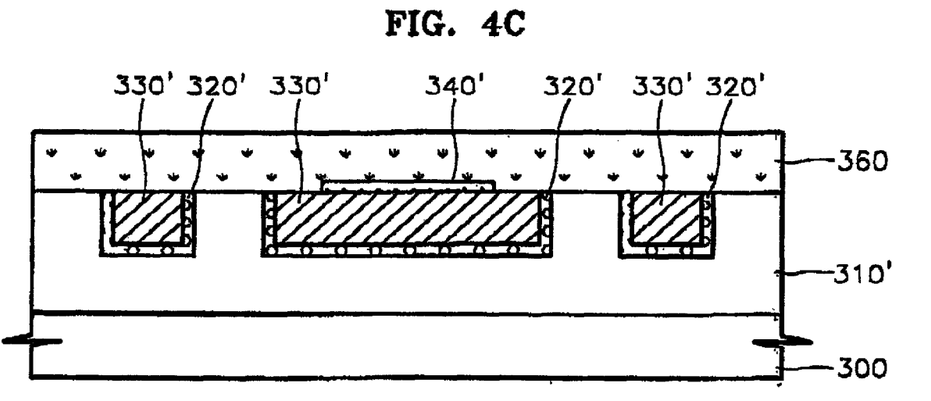

FIGS. 4A to 4C illustrate another method of forming damascene wiring in accordance with the present invention when the damascene wiring contains wide damascene regions. Referring to FIG. 4A, insulative layer 310 and barrier layer 320 are formed as described above. Then, conductive layer 330 is deposited or otherwise formed on the entire surface of barrier layer 320. Preferably, conductive layer 330 is 500 to 1000 Å thinner than the depth of damascene regions 315 in insulative layer 310, to prevent planarization from completely removing of a dummy layer 340 which is formed on conductive layer 330. As above, dummy layer 340 is patterned to overlie portions of conductive layer 330 that fill wide damascene regions 315. A second conductive layer 410 is then deposited on conductive layer 330 and dummy layer 340. Second conductive layer 410 can be Cu, Al, Ag, Au, or an alloy of Cu, Al, Ag, or Au and typically contains the same material as conductive layer 330.

Then, as shown in FIG. 4B, a CMP process planarizes the structure of FIG. 4A to form damascene metal wiring pattern 330'. Planarization removes portions of second conductive layer 410, conductive layer 330, dummy layer 340, and barrier layer 320 to expose insulative layer 310. In FIG. 4B, part of dummy pattern 340' remains after planarization. This ensures that damascene metal wiring pattern 330' underlying dummy pattern 340' has at least the original thickness of conductive layer 330.

Then, as shown in FIG. 4C, an upper dielectric layer 360 is deposited on semiconductor substrate 300, covering damascene metal wiring pattern 330' and dummy layer 340'.

Figure 5A:
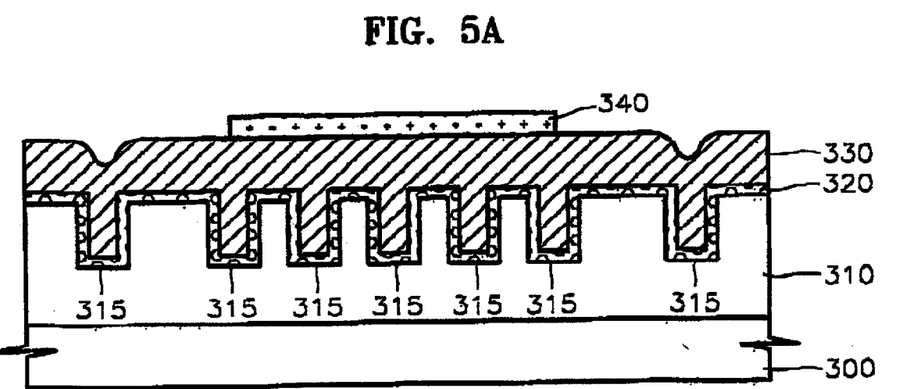
FIGS. 5A to 5C are cross-sectional views of semiconductor structures illustrating a method according to an embodiment of the present invention for forming damascene wiring including closely packed damascene regions.
Figure 5B:
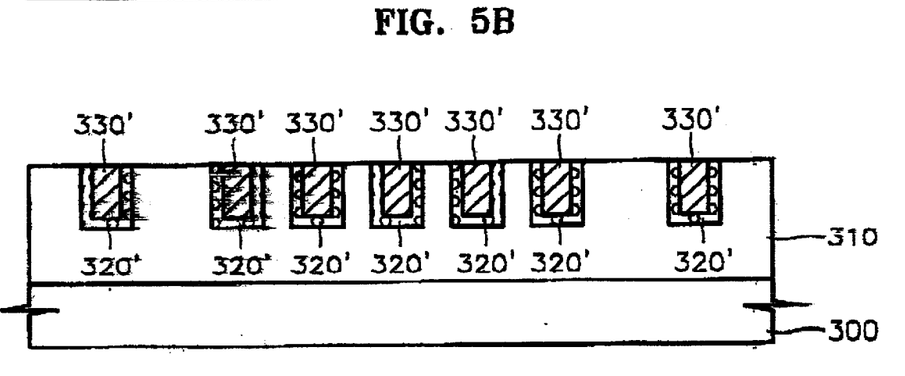
Figure 5C:
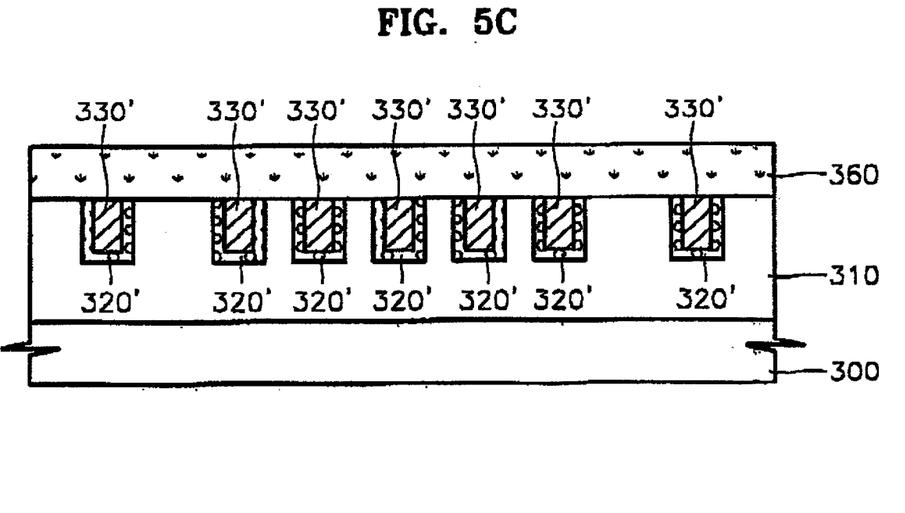

FIGS. 5A to 5C illustrate another method of forming damascene wiring in accordance with an embodiment of the present invention. Referring to FIG. 5A, the processes described with reference to FIGS. 3A to 3E form insulative layer 310, barrier layer 320, and conductive layer 330. However, in FIG. 5A, damascene regions 315 are closely packed and occupy a high percentage of the area in some portions of the semiconductor structure. Dummy layer 340 is formed on a portion of conductive layer 330, under which damascene regions 315 are closely packed. Specifically, damascene regions 315 are defined to be closely packed where damascene regions 315 occupy 20% or more of the surface area of insulative layer 310. It is preferable that a selectivity ratio of dummy layer 340 to conductive layer 330 in the subsequent chemical mechanical polishing is 1:1 to 1:2. Preferably, dummy layer 340 is formed from a $SiO_2$ layer about 500 to 3000 Å thick.

CMP planarizes the structure of FIG. 5A to provide the structure of FIG. 5B. The CMP removes dummy layer 340, portions of conductive layer 330, and barrier layer 320 until insulative layer 310 is exposed. Dummy layer 340 slows removal of material, in the area of high density damascene metal wiring 330' and thus prevents over-polishing and erosion.

As shown in FIG. 5C, an upper dielectric layer 360 is deposited on semiconductor substrate 300, covering damascene metal wiring pattern 330'.

Figure 6A:
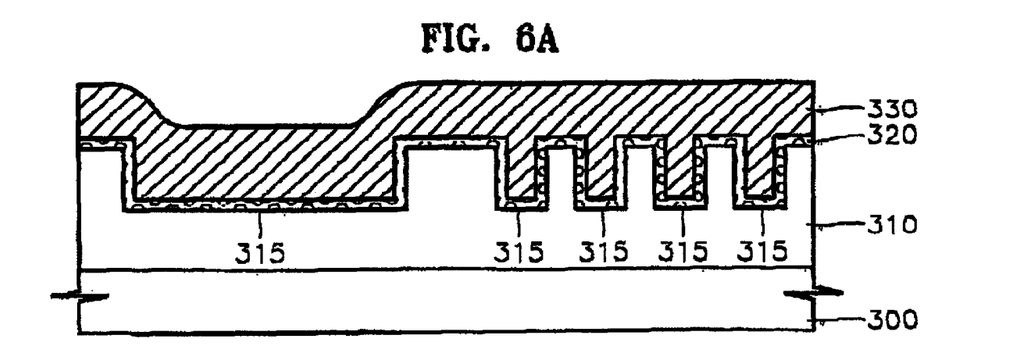
FIGS. 6A to 6E are cross-sectional views of semiconductor structures illustrating a method according to another embodiment of the present invention for forming damascene wiring including both wide and closely packed damascene regions.
Figure 6B:
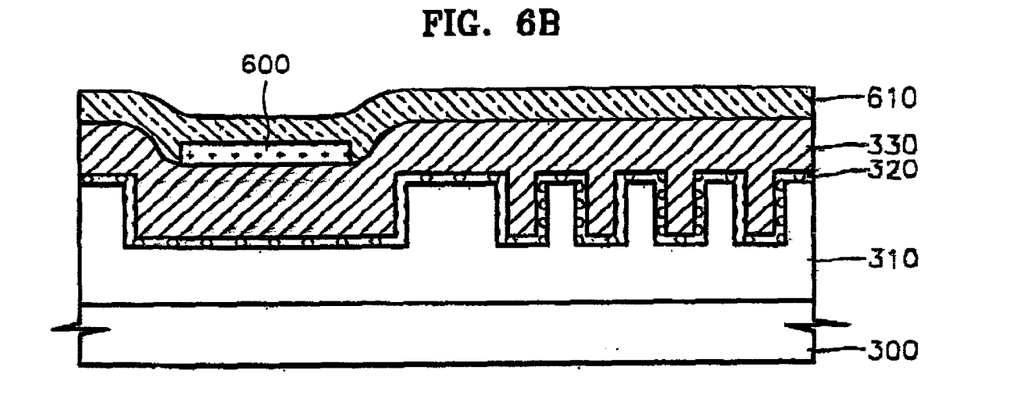
Figure 6C:
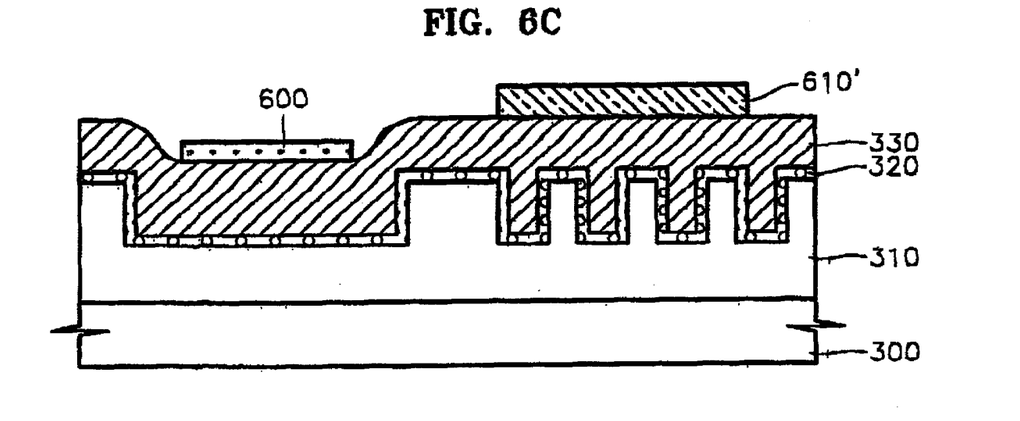

FIGS. 6A to 6E illustrate a method of forming damascene wiring in accordance with another embodiment of the present invention. Referring to FIG. 6A, insulative layer 310, barrier layer 320, and conductive layer 330 are formed in the same manner described with reference to FIGS. 3A to 3E. In the embodiment of FIG. 6A, the desired pattern for the damascene wiring includes a wide metal region and an area where damascene regions are closely packed. As shown in FIG. 6B, a first dummy layer 600 is formed on a portion of conductive layer 330, under which a wide damascene region 315 has a width of 10 µm or more, and a pre-dummy layer 610 is formed on conductive layer 330 and first dummy layer 600. Referring to FIG. 6C, pre-dummy layer 610 is patterned to form a second dummy pattern 610' that covers a portion of conductive layer 330, under which closely packed damascene regions 315 occupy 20% or more of the surface area of insulative layer 310. First dummy layer 600 resists CMP better than second dummy layer 610' does. For example, the CMP selectivity ratio of the dummy layers 600 and 610' to the conductive layer 330 can be 1:5 and 1:1 to 1:2, respectively.

Figure 6D:
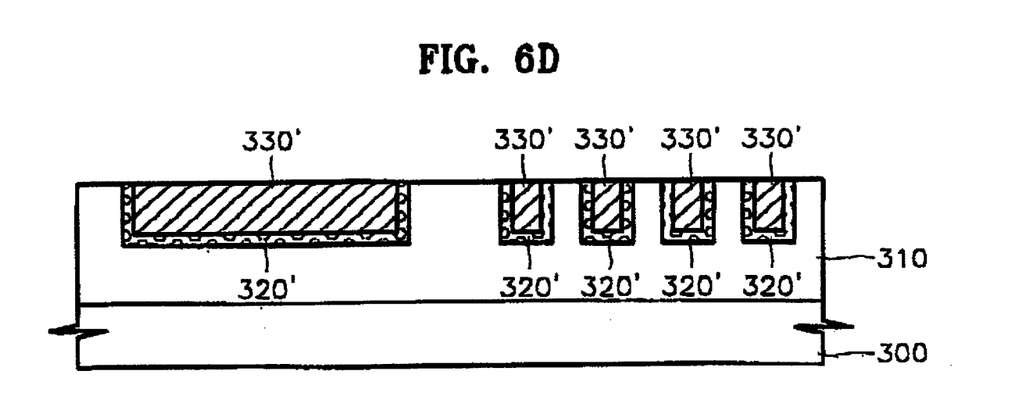
Figure 6E:
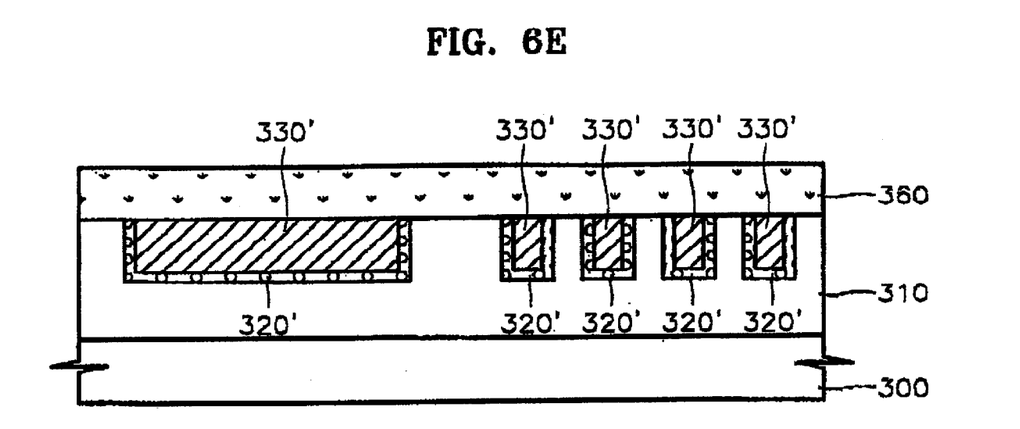

CMP planarizes the structure of FIG. 6C to produce the structure of FIG. 6D. The CMP removes dummy layers 600 and 610', portions of conductive layer 330 and barrier layer 320 until insulative layer 310 is exposed. As a result, dummy layers 600 and 610' prevent dishing and erosion when forming damascene wiring patterns 330'. Then, as shown in FIG. 6E, an upper dielectric layer 360 is deposited on semiconductor substrate 300, covering damascene wiring patterns 330'.

Forming a $SiO_2$, $Si_3N_4$, $TiO_2$, or TiN layer by CVD and patterning the layer can form dummy layer 600. The thickness of dummy layer 600 is preferably 500 to 5000 Å. Also, it is preferable that a selectivity ratio of dummy layer 600 to conductive layer 330 in chemical mechanical polishing (CMP) is about 1:5. A typical selectivity ratio of dummy layer 610' to conductive layer 330 in chemical mechanical polishing (CMP) is 1:1 to 1:2. Preferably, dummy layer 610' is formed of a 500 to 3000 Å thick $SiO_2$ layer.

Figure 7A:
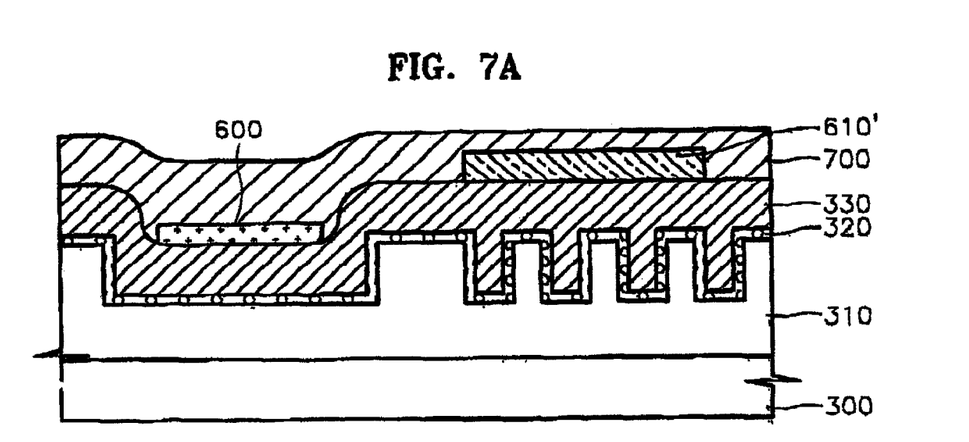
FIGS. 7A to 7C are cross-sectional views of semiconductor structures illustrating another method according to another embodiment of the present invention for forming damascene wiring including both wide and closely packed damascene regions.
Figure 7B:
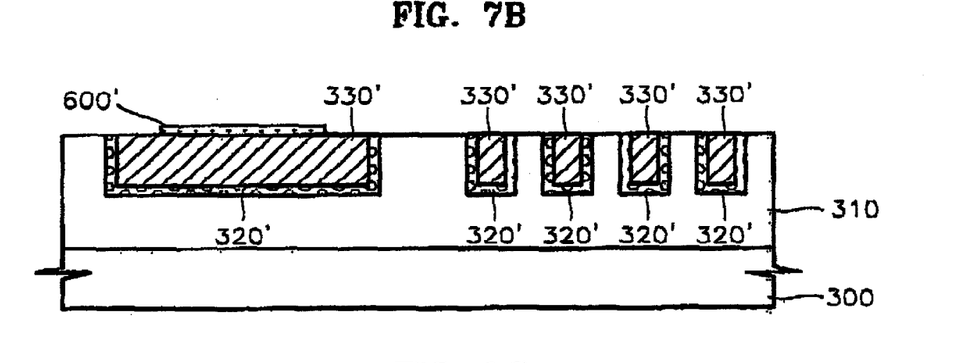
Figure 7C:
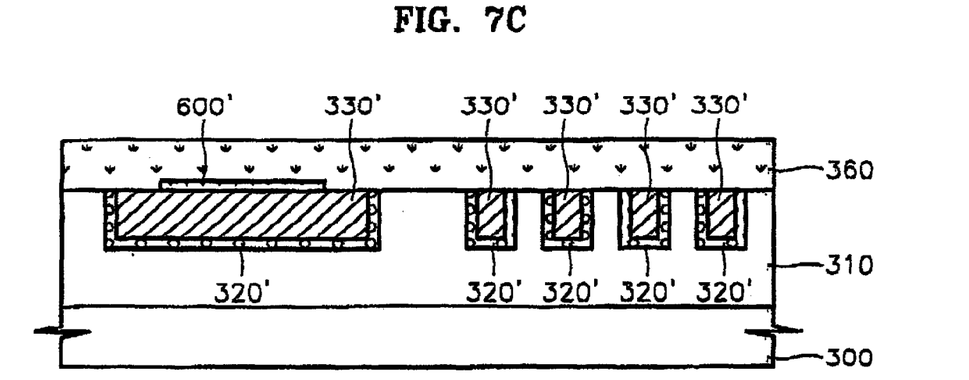

In accordance with another embodiment of the present invention, FIGS. 7A to 7C illustrate another method of forming damascene metal wiring when a portion of the damascene metal wiring is closely packed and another portion of the damascene metal wiring is wide. Referring to FIG. 7A, insulative layer 310, barrier layer 320, conductive layer 330, and dummy layers 600 and 610' are formed using the same methods described with reference to FIGS. 6A to 6E. However, the top surface of conductive layer 330, on which dummy layer 600 is formed, is about 500 to 1000 Å below the top surface of insulative layer 310. Then, a second conductive layer 700 is formed on conductive layer 330 and dummy layers 600 and 610'.

Referring to FIG. 7B, CMP planarizes the structure of FIG. 7A to form damascene metal wiring patterns 330'. The CMP removes upper portions of second conductive layer 700, dummy layers 600 and 610', conductive layer 330, and barrier layer 320 until insulative layer 310 is exposed. In this embodiment, although the CMP removes the top portion of dummy layer 600, a portion of dummy layer 600 that was below the top surface of insulative layer 310 remains on damascene wiring pattern 330'. Then, as shown. in FIG. 7C, upper dielectric layer 360 is deposited on semiconductor substrate 300, covering damascene wiring patterns 330' and first dummy layer 600'.

Figure 8:
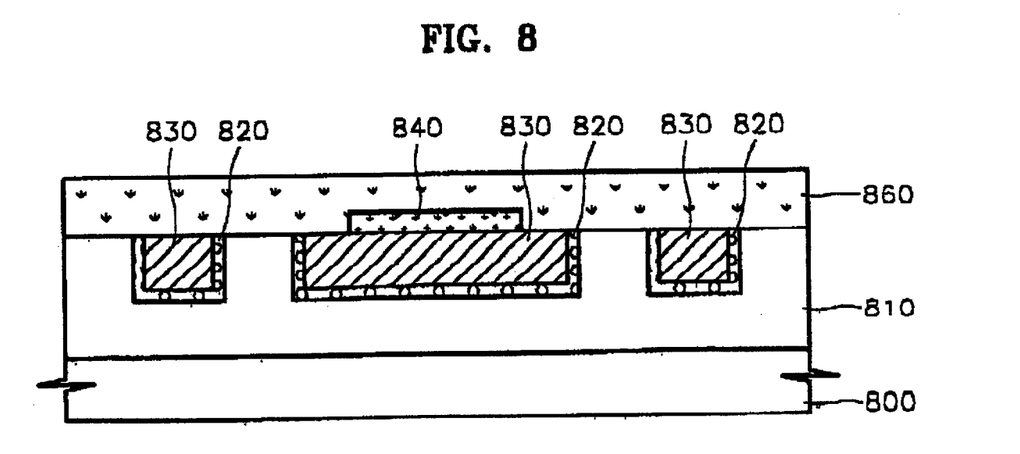
FIG. 8 is a cross-sectional view of a device containing damascene wiring according to an embodiment of the present invention.
Figure 9:
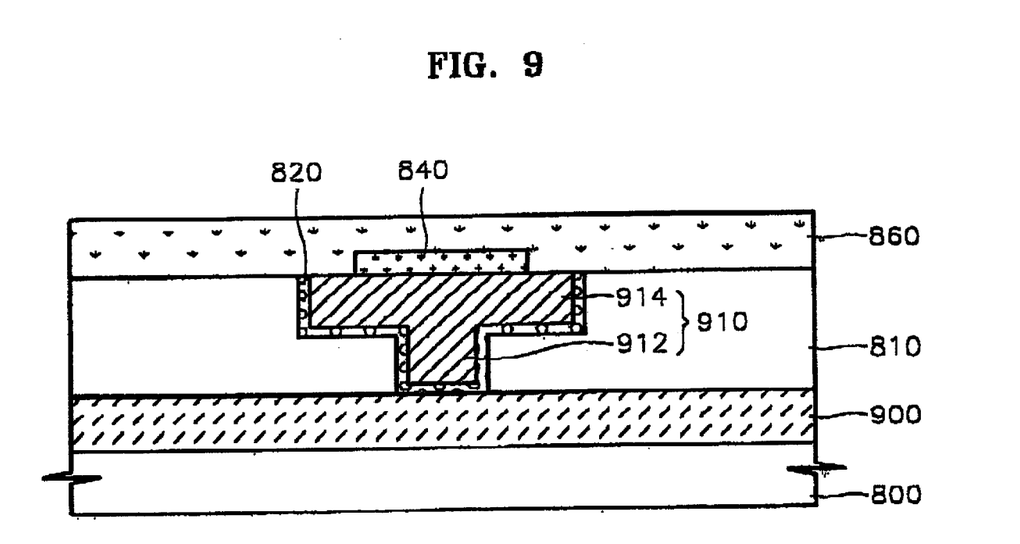
FIG. 9 is a cross-sectional view of another embodiment of a device containing damascene wiring according to the present invention.

FIGS. 8 and 9 illustrate semiconductor devices including damascene wirings in accordance with the present invention. FIG. 8 is basically identical to FIG. 4C.

The methods according to the present invention can be applied not only to a single damascene process described above but also to a dual damascene process. Also, the damascene metal wiring according to the present invention can be used for forming a via contact connecting lower and upper metal wirings to each other, and for connecting a metal wiring to an active region of a semiconductor device.

The embodiment of FIG. 9 is similar to that of FIG. 8 but includes a via. Referring to FIG. 9, a lower writing layer 900 is between semiconductor substrate 800 and insulative layer 810. A damascene wiring pattern 910 includes a wider portion 914 and a narrower portion 912. The damascene regions for damascene wiring pattern 910 can be formed by patterning insulative layer 810 twice. Narrower portion 912 acts as a via contact connecting wider portion 914 of damascene wiring pattern 910 to lower wiring layer 900.

As described above, the dummy layers prevent dishing and erosion of Damascene metal wirings by delaying or preventing the CMP removal of the Damascene metal wirings under the dummy patterns.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A method of forming damascene wiring in a semiconductor device, comprising:
   forming an insulative layer;
   patterning the insulative layer to form a damascene region in the insulative layer;
   forming a first conductive layer on the surface of the insulative layer, the conductive layer filling the damascene region;
   forming a dummy layer on a portion of the first conductive layer that is in the damascene region, wherein a top surface of the portion of the first conductive layer in the damascene region is lower than a top surface of the insulative layer;
   forming a second conductive layer on the first conductive layer and the dummy layer; and
   planarizing a resulting structure by removing portions of the dummy layer and the first and second conductive layers until the insulative layer is exposed, such that a portion of the dummy layer remains after the planarization of the resulting structure.

2. The method of claim 1, wherein the first conductive layer is formed of a metal selected from a group consisting of copper, aluminum, silver, gold, and alloys thereof.

3. The method of claim 1, further comprising forming a barrier layer on the insulative layer after patterning the insulative layer.

4. The method of claim 1, wherein chemical mechanical polishing performs the planarizing.

5. The method of claim 4, wherein a selectivity of the dummy layer against the chemical mechanical polishing is lower than that of the first conductive layer.

6. The method of claim 5, wherein a selectivity ratio of the dummy layer to the first conductive layer is 1 to 5.

7. The method of claim 1, wherein the dummy layer is formed of a material selected from a group consisting of $SiO_2$, $Si_3N_4$, $TiO_2$, and TiN.

8. The method of claim 1, wherein a thickness of the dummy layer is between 500 Å and 5000 Å.

9. The method of claim 1, wherein a difference in heights between the top surface of the portion of the first conductive layer in the damascene region and the top surface of the insulative layer is between 500 Å and 1000 Å.

10. The method of claim 1, wherein a width of the damascene region under the dummy layer is 10 µm or more.

11. The method of claim 1, wherein the patterning of the insulative layer forms a plurality of damascene regions, and the dummy layer is formed on a portion of the first conductive layer, under which the damascene regions occupy 20% or more of a total area under the dummy layer.

12. The method of claim 11, wherein chemical mechanical polishing performs the planarizing.

13. The method of claim 12, wherein a selectivity of the dummy layer against the chemical mechanical polishing is the same as or lower than that of the first conductive layer.

14. The method of claim 13, wherein a selectivity ratio of the dummy layer to the first conductive layer is between 1 to 1 and 1 to 2.

15. The method of claim 11, wherein the dummy layer is formed of $SiO_2$.

16. The method of claim 11, wherein a thickness of the dummy layer is between 500 Å and 3000 Å.

17. A method of forming damascene wiring in a semiconductor device, comprising:
    forming an insulative layer;
    patterning the insulative layer to form a plurality of damascene regions in the insulative layer;
    forming a first conductive layer on the surface of the insulative layer, the first conductive layer filling the damascene regions;
    forming a first dummy layer on a portion of the first conductive layer in a first portion of the damascene regions;
    forming a second dummy layer on a portion of the first conductive layer, under which a second portion of the damascene regions is located; and
    planarizing a resulting structure by removing portions of the first and second dummy layers and the first conductive layer until the insulative layer is exposed.

18. The method of claim 17, wherein chemical mechanical polishing performs the planarizing.

19. The method of claim 18, wherein a selectivity of the first dummy layer against the chemical mechanical polishing is lower than that of the first conductive layer.

20. The method of claim 19, wherein a selectivity ratio of the first dummy layer to the first conductive layer is 1 to 5.

21. The method of claim 18, wherein a selectivity of the second dummy layer against the chemical mechanical polishing is the same as or lower than that of the first conductive layer.

22. The method of claim 21, wherein a selectivity ratio of the second dummy layer to the first conductive layer is between 1 to 1 and 1 to 2.

23. The method of claim 17, further comprising forming a second conductive layer on the first and second dummy layers and the first conductive layer.

24. The method of claim 23, wherein a top surface of the portion of the first conductive layer below the first dummy layer is lower than a top surface of the insulative layer.

25. The method of claim 24, wherein the height difference between the top surface of the portion of the first conductive layer below the first dummy layer and the top surface of the insulative layer is between 500 Å and 1000 Å.

26. The method of claim 24, wherein a portion of the first dummy layer remains after the planarizing.

27. The method of claim 17, wherein a width of the first portion of the damascene regions, which is under the first dummy layer, is 10 µm or more.

28. The method of claim 17, wherein the damascene regions are closely packed in the second portion of the damascene regions.

* * * * *